United States Patent [19]
Nagai et al.

[11] Patent Number: 5,577,063
[45] Date of Patent: Nov. 19, 1996

[54] SEMICONDUCTOR LASER WITH IMPROVED WINDOW STRUCTURE

[75] Inventors: Yutaka Nagai; Akihiro Shima, both of Hyogo, Japan

[73] Assignee: Mitsubishi Denki Kabushiki Kaisha, Tokyo, Japan

[21] Appl. No.: 469,820

[22] Filed: Jun. 6, 1995

[30] Foreign Application Priority Data

Oct. 11, 1994 [JP] Japan .................. 6-245615

[51] Int. Cl.⁶ .................................. H01S 3/19
[52] U.S. Cl. ............................ 372/46; 372/45
[58] Field of Search ........................... 372/43–46

[56] References Cited

U.S. PATENT DOCUMENTS

| | | | |
|---|---|---|---|
| 4,845,725 | 7/1989 | Welch et al. | 372/46 |
| 4,875,216 | 10/1989 | Thornton et al. | 372/45 |
| 5,455,429 | 10/1995 | Paoli et al. | 372/46 |
| 5,469,457 | 11/1995 | Nagai et al. | 372/46 |

FOREIGN PATENT DOCUMENTS 6226882  7/1985  Japan .

OTHER PUBLICATIONS

Arimoto et al, "150 mW Fundamental-Transverse-Mode Operation of 670 nm Window Laser Diode", IEEE Journal of Quantum Electronics, vol., 29, No. 6, Jun. 1993, pp. 1874–1979.

*Primary Examiner*—James W. Davie
*Attorney, Agent, or Firm*—Leydig, Voit & Mayer

[57] ABSTRACT

A semiconductor laser includes a compound semiconductor substrate of a first conductivity type; successively disposed on said semiconductor substrate, a first conductivity type lower cladding layer, an active layer including a multiple quantum well structure, first and second upper cladding layers of a second conductivity type opposite the first conductivity type, and a first contacting layer of the second conductivity type in electrical contact with the second upper cladding layer; first and second electrodes in electrical contact with the semiconductor substrate and the first contacting layer, respectively, the semiconductor laser including opposed facets transverse to the lower cladding and the first and second upper cladding layers, the second upper cladding layer having a ridge shape that extends between the facets of the semiconductor laser and is centrally disposed on the first upper cladding layer; a first conductivity type current blocking layer disposed on and between the first upper cladding layer and the first contacting layer, contacting opposite sides of the ridge, and extending between the facets; and a window structure contiguous with each of the facets, each window structure comprising a region including a dopant impurity, each region being disposed within parts of the lower cladding layer, the active layer, and the first upper cladding layer opposite the ridge but not extending substantially into the second upper cladding layer, the multiple quantum well structure of the active layer being disordered in each window region.

9 Claims, 11 Drawing Sheets

2

SEMICONDUCTOR LASER WITH IMPROVED WINDOW STRUCTURE

FIELD OF THE INVENTION

The present invention relates to a semiconductor laser including an improved window structure at a light emitting facet for producing increased light power output without damaging the semiconductor laser and a method of making the semiconductor laser.

BACKGROUND ART

FIGS. 8(a) and 8(b) are views of a semiconductor laser 80 including a window structure of the facets of the laser. FIG. 8(a) is an end view showing one of the facets of the semiconductor laser and FIG. 8(b) is a longitudinal sectional view perpendicular to the facets taken along line 8b—8b of FIG. 8(a). The semiconductor laser 80 includes an n-type GaAs substrate 1 on which are successively disposed an n-type $Al_{0.5}Ga_{0.5}As$ lower cladding layer 2 and an active layer 3 having a multiple quantum well structure including a plurality of alternating AlGaAs well layers and AlGaAs barrier layers. Successively disposed on the active layer 3 are a p-type $Al_{0.5}Ga_{0.5}As$ upper cladding layer 4, an n-type GaAs current blocking layer 8, and a p-type GaAs second contacting layer 9. The upper cladding layer 4 includes a portion sandwiched between the current blocking layer 8 and the active layer 3 and a centrally disposed ridge 14. Centrally disposed within the laser, sandwiched by parts of the current blocking layer 8 and contacting the ridge 14 of the upper cladding layer 4, is a p-type GaAs first contacting layer 5 that is part of the ridge 14. The first contacting layer 5 contacts the second contacting layer 9 in the same plane as the interface of the second contacting layer 9 and the current blocking layer 8.

The semiconductor laser of FIGS. 8(a) and 8(b) includes a window structure 6 at each of its facets, best seen in FIG. 8(b). The window structures 6 comprise regions into which silicon ions have been implanted. The implantation, after annealing, causes disordering of the active layer 3 within the region 6 so that regions 7 of the active layer lack the multiple quantum well structure that is present elsewhere in the active layer 3. Electrodes 10 and 11 are respectively disposed on the second contacting layer 9 and the substrate 1.

A method of making the semiconductor laser of FIGS. 8(a) and 8(b) is illustrated in FIGS. 9(a)–9(f). Initially, as illustrated in FIG. 9(a), the lower cladding layer 2, the active layer 3, the upper cladding layer 4, and the first contacting layer 5 are successively and epitaxially grown on the substrate 1. Thereafter, a photoresist film 12 is formed on the first contacting layer 5 and a window 13 is opened in the photoresist film 12 using photolithographic techniques. The opening 13 may be a square 40 microns on a side. The resist film 12 is used as an ion implantation mask and dopant impurity ions, preferably silicon, are implanted in the structure through the opening 13. The photoresist film 12 prevents silicon ions from entering parts of the layers not exposed by the opening 13. The ion implantation step produces an implanted region 6 illustrated in a cross-sectional view in FIG. 9(c) that extends through a part of the first contacting, upper cladding, and active layers and into the lower cladding layer 2. After removal of the photoresist film 12, the implanted silicon ions are activated by annealing, resulting in disordering of the multiple quantum well structure in the portion of the active layer 3 where the silicon ions are present. This annealing and activation process is conventionally carried out in an As ambient at a temperature of at least 700° C.

As illustrated in FIG. 9(d), an etching mask of an electrically insulating material, such as $Si_3N_4$, $SiO_2$, or the like, is formed on a part of the first contacting layer 5 in a stripe-shaped pattern. That insulating film mask is used to define a ridge extending between the facets of the semiconductor laser and aligned with the implanted and disordered regions of the active layer 3. Where not protected by the etching mask 15, the first contacting layer 5 and the upper cladding layer 4 are chemically etched and removed, leaving a ridge structure 14, as shown in FIG. 9(d), in place. The selective etching may employ as an etchant a mixture of tartaric acid and hydrogen peroxide or a mixture of sulfuric acid, hydrogen peroxide, and water.

As illustrated in FIG. 9(e), the n-type GaAs current blocking layer 8 is epitaxially grown on the upper cladding layer 4 opposite the active layer 3 and in contact and sandwiching the ridge 14. The insulating film etching mask 15 remains in place during the growth step. If a chemical vapor deposition process, such as metal organic chemical vapor deposition (MOCVD), is employed to grow the current blocking layer 8, no crystalline growth occurs on the insulating film mask 15. Following the growth of the current blocking layer 8, the insulating film mask 15 is removed by wet or dry etching and the second contacting layer 9 is grown on the current blocking layer 8 and the first contacting layer 5. The semiconductor laser is completed by forming the electrodes 10 and 11. Although not illustrated, but known to those of skill in the art, the process of forming the semiconductor laser includes cleaving to form the facets. FIG. 9(b) illustrates ion implantation to form one window region of many such regions on a semiconductor wafer from which many semiconductor lasers are obtained. When the wafer is cleaved at locations intersecting the windows 13, each of the resulting semiconductor lasers includes two opposed facets, as shown in FIG. 8(b). Only one of those facets is illustrated in the end view of FIGS. 8(a) and 9(f).

When the semiconductor laser of FIGS. 8(a) and 8(b) is forward biased, holes are injected into the active layer 3 including the quantum well structure through the second contacting layer 9, the first contacting layer 5, and the upper cladding layer 4. Electrons are injected into that active layer 3 through the substrate 1 and the lower cladding layer 2. The electrons and holes recombine in the active layer 3 and produce light. When the current flow exceeds the laser oscillation threshold of the semiconductor laser, laser oscillation producing coherent light occurs. The flow of holes into the active layer 3 is concentrated in a central portion of that layer by the ridge 14 that is confined by the current blocking layer 8. The rectifying junctions formed between the current blocking layer 8 and the ridge 14 restrict the area of current flow, increasing the current density for producing laser oscillation. The GaAs current blocking layer 8 has a smaller energy band gap than the effective energy band gap of the active layer and, therefore, absorbs light produced in the active layer 3. This light absorption concentrates the light produced by the laser in the ridge 14, producing a stable, single mode oscillation.

The window structure 6 enables the light output power to be increased without risk of damage to the semiconductor laser at the facets. In semiconductor lasers employed to retrieve stored information from a compact disc, the laser light has a wavelength of about 800 nanometers and the maximum power is limited by heating at the facets which, in a worst case, causes melting of the semiconductor materials in the laser and destruction of the laser. Heating occurs at the facets because of the absorption of light. In order to increase the output power of the laser light that may be safely produced without risking damage to the laser, it is necessary to reduce the amount of light absorbed at the facets. The window structure 6 and, particularly, the disordered region 7 of the active layer 3 at each of the laser facets reduce light absorption. The disordering of the multiple quantum well structure within the active layer 3 at the facets increases the effective energy band gap of the active layer in those regions, resulting in reduced light absorption.

The disordering of the multiple quantum well structure at the laser facets may be easily understood in conjunction with FIGS. 10(a) and 10(b). FIG. 10(a) is a profile of the relative concentration of aluminum in layers of the semiconductor laser. Within the active layer 3, a periodic structure of the well and barrier layers is present. That periodic structure has a periodic variation in the concentration of aluminum, as illustrated in FIG. 10(a). Within the multiple quantum well structure, the aluminum concentration varies from a maximum aluminum concentration of $Al_1$ to a minimum concentration of $Al_2$. As seen in FIG. 10(a), the multiple quantum well structure is sandwiched by layers of constant aluminum concentration within the active layer. Still higher levels of aluminum concentration are present in the cladding layers that sandwich the active layer.

FIG. 10(b) illustrates the variation in aluminum composition in the active layer 3 within the window region, i.e., in region 7. Because of the disordering by the implantation of silicon ions and annealing, the aluminum composition within the active layer is essentially homogeneous at a concentration of $Al_3$, a concentration intermediate the concentrations $Al_1$ and $Al_2$, the respective concentrations in a well layer and a barrier layer before disordering. In general, the well layer thickness is no more than 20 nanometers so that disordering of a region of the quantum well structure produced by the diffusion of dopant impurities, such as silicon and zinc, homogenizes the structure, producing a material having an energy band gap larger than the effective energy band gap of the quantum well structure. Thus, the window region 7 of the active layer 3 has significantly reduced absorption of the light produced elsewhere in the active layer 3.

In the ion implantation process illustrated in FIGS. 9(b) and 9(c), the active layer 3 is usually spaced from the exposed surface of the first contacting layer 5 by a distance of at least 1.7 microns, the sum of the thicknesses of the upper cladding layer 4, at least 1.5 microns, and of the first contacting layer 5, a thickness of at least 0.2 micron. These thicknesses are important to ensure that the light produced in the active layer 3 is absorbed within the semiconductor laser structure transverse to the ridge. In order to implant silicon ions through the opening 13 that reach the active layer 3 in the necessary concentration for subsequent disordering of window regions of the active layer 3, the silicon ions must have an energy of at least 2 MeV. These high energy dopant ions damage the compound semiconductor layer through which they pass, producing many crystalline defects. Even though some of the crystalline defects are removed by the annealing step in the activation of the implanted ions, a significant concentration of crystalline defects remains. The crystalline defects absorb some of the laser light and, therefore, interfere with the desired properties, i.e., non-absorption, of the window structure. In addition, the crystalline defects trap the implanted dopant ions and interfere with or prevent their diffusion during the annealing and activation step, limiting the degree of disordering that is achieved in the window structure.

SUMMARY OF THE INVENTION

It is an object of the invention to provide a semiconductor laser having an improved window structure at facets of the laser that do not absorb laser light.

It is another object of the invention to provide a semiconductor laser including an improved window structure produced, in part, by ion implantation by implanting ions at lower energies than previously employed.

It is a further object of the invention to provide a method for producing the semiconductor laser with an improved window structure.

A semiconductor laser according to the invention comprises a compound semiconductor substrate of a first conductivity type; successively disposed on said semiconductor substrate, a first conductivity type lower cladding layer, an active layer including a multiple quantum well structure, first and second upper cladding layers of a second conductivity type opposite the first conductivity type, and a first contacting layer of the second conductivity type in electrical contact with the second upper cladding layer; first and second electrodes in electrical contact with the semiconductor substrate and the first contacting layer, respectively, the semiconductor laser including opposed facets transverse to the lower cladding and the first and second upper cladding layers, the second upper cladding layer having a ridge shape that extends between the facets of the semiconductor laser and is centrally disposed on the first upper cladding layer; a first conductivity type current blocking layer disposed on and between the first upper cladding layer and the first contacting layer, contacting opposite sides of the ridge, and extending between the facets; and a window structure contiguous with each of the facets, each window structure comprising a region including a dopant impurity and disposed within parts of the lower cladding layer, the active layer, and the first upper cladding layer opposite the ridge but not extending substantially into the second upper cladding layer, the multiple quantum well structure of the active layer being disordered in each window region.

A method of making a semiconductor laser according to the invention comprises successively growing on a semiconductor substrate of a first conductivity type a first conductivity type lower cladding layer, an active layer including a multiple quantum well structure, and a first upper cladding layer of a second conductivity type opposite the first conductivity type; forming an ion implantation mask on the first upper cladding layer, the ion implantation mask including an opening exposing a portion of the first upper cladding layer where a laser facet is to be formed subsequently; implanting dopant impurity ions in the lower cladding layer, the active layer, and the first upper cladding layer through the opening in the ion implantation mask; removing the ion implantation mask and annealing to activate the implanted dopant ions, thereby disordering the multiple quantum well structure in the active layer where the implanted dopant ions are present; successively growing a second conductivity type second upper cladding layer and a second conductivity type first contacting layer on the first upper cladding layer; forming a stripe-shaped etching mask aligned with the disordered part of the active layer on the first contacting layer and etching and thereby removing portions of the first contacting layer and the second upper cladding layer to form a ridge; growing a first conductivity type current blocking layer on the first upper cladding layer contacting sides of the ridge; removing the etching mask and growing a second conductivity type second contacting layer on the current blocking layer and the first contacting layer; and forming respective electrodes on the substrate and the second contacting layer.

Still another method of making a semiconductor laser according to the invention comprises successively growing on a semiconductor substrate of a first conductivity type a first conductivity type lower cladding layer, an active layer including a multiple quantum well structure, and a first upper cladding layer of a second conductivity type opposite the first conductivity type; forming a stripe-shaped ion implantation mask on the first upper cladding layer having ends spaced from what will become facets of the semiconductor laser; implanting dopant impurity ions in parts of the lower cladding layer, the active layer, and the first upper cladding layer not covered by the ion implantation mask; removing the ion implantation mask and annealing to activate the implanted dopant ions, thereby disordering the multiple quantum well structure in the active layer where the implanted dopant ions are present; successively growing a second conductivity type second upper cladding layer and a second conductivity type first contacting layer on the first upper cladding layer; forming a stripe-shaped etching mask on the first contacting layer aligned with the part of the active layer that is not disordered and etching and thereby removing portions of the first contacting layer and second upper cladding layer to form a ridge; growing a first conductivity type current blocking layer on the first upper cladding layer contacting sides of the ridge; removing the etching mask and growing a second conductivity type second contacting layer on the current blocking layer and the first contacting layer; and forming respective electrodes on the substrate and the second contacting layer.

Other objects and advantages of the present invention will become apparent from the detailed description given hereinafter. It should be understood, however, that the detailed description and specific embodiments are provided by way of illustration only since various changes and modifications within the scope of the invention will become apparent to those skilled in the art from this detailed description.

BRIEF DESCRIPTION OF THE DRAWINGS

In all figures, like elements are given the same reference numbers.

DETAILED DESCRIPTION OF PREFERRED EMBODIMENTS

Figure 1A:
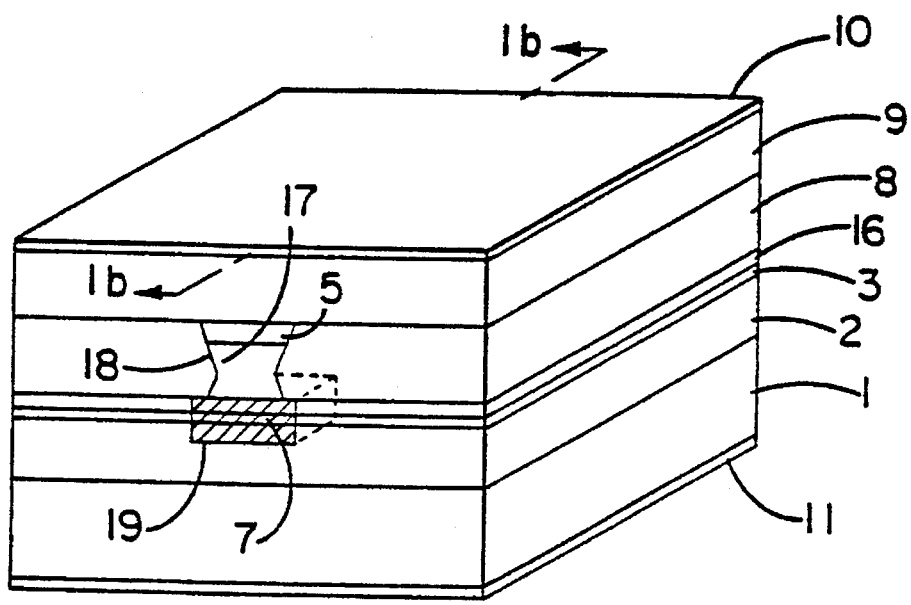
FIGS. 1(a) and 1(b) are a perspective and cross-sectional view, respectively, illustrating a semiconductor laser in accordance with an embodiment of the invention.
Figure 1B:
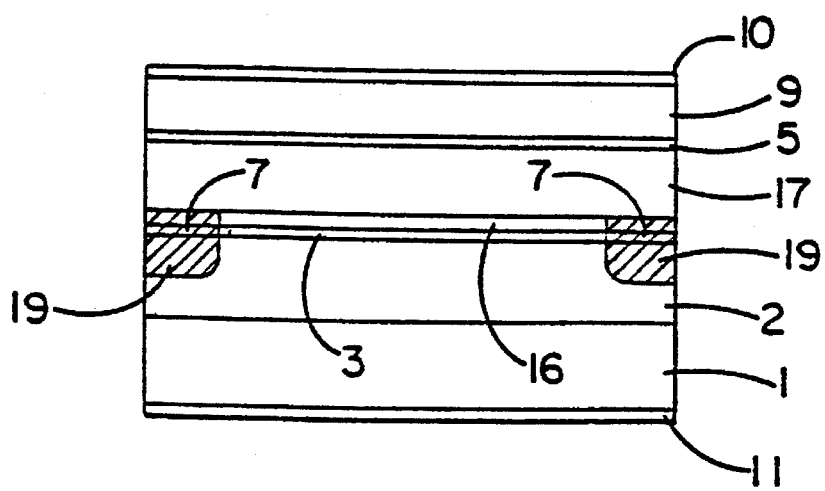

FIGS. 1(a) and 1(b) are perspective and cross-sectional views, respectively, of a semiconductor laser 30 according to an embodiment of the invention. FIG. 1(b) is a sectional view taken along line 1b—1b of FIG. 1(a).

The semiconductor laser includes an n-type GaAs substrate 1 on which are successively disposed an n-type $Al_{0.5}Ga_{0.5}As$ lower cladding layer 2, an active layer 3 including a multiple quantum well structure comprising alternating AlGaAs well layers and AlGaAs barrier layers, and a p-type $Al_{0.5}Ga_{0.5}As$ first upper cladding layer 16. The first upper cladding layer 16 has a thickness in a range of from about 0.05 to about 0.5 micron. A p-type $Al_{0.5}Ga_{0.5}As$ second upper cladding layer 17 having a ridge shape is disposed on a central part of the first upper cladding layer 16 and extends between the facets of the semiconductor laser. The second upper cladding layer 17 has a minimum thickness in a range from about 1.0 to about 1.45 microns. A p-type GaAs first contacting layer 5 is disposed on the second upper cladding layer as part of a ridge 18 and extends between the two opposed facets of the semiconductor laser. An n-type GaAs current blocking layer 8 is disposed on the first upper cladding layer 16 sandwiching the ridge 18. A p-type GaAs second contacting layer 9 is disposed on the current blocking layer 8 and the first contacting layer 5. Electrodes 10 and 11 are disposed on the second contacting layer 9 and the substrate 1, respectively.

The semiconductor laser of FIGS. 1(a) and 1(b) includes a window region 19 at each of the facets. As particularly shown in FIG. 1(b), each window region encompasses parts of the lower cladding layer 2, the active layer 3, and the first upper cladding layer 16. Those window regions 19 are formed by ion implantation, such as the implantation of silicon ions. It is an important feature of the invention that the window regions 19 do not appreciably extend into the second upper cladding layer 17.

Figure 2A:
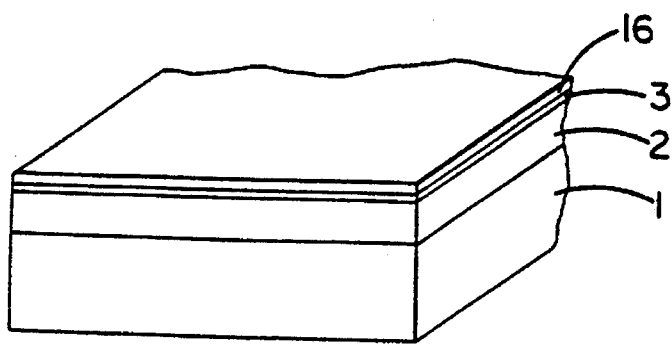
FIGS. 2(a)–2(g) illustrate steps in a method of producing the semiconductor laser illustrated in FIG. 1(a) in accordance with an embodiment of the invention.
Figure 2B:
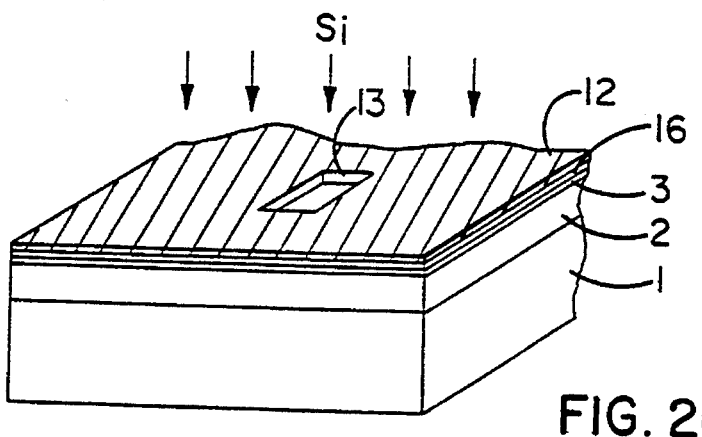
Figure 2C:
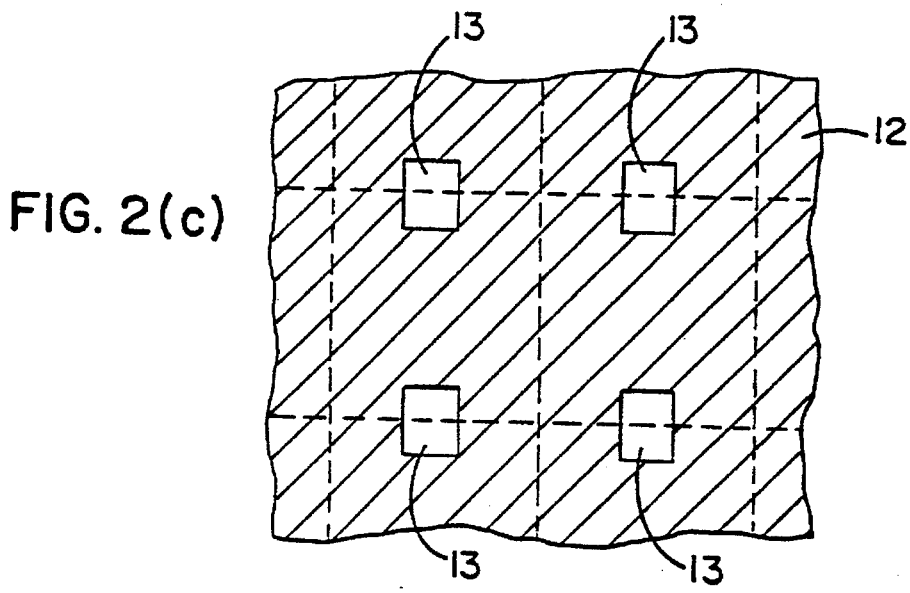

A method of making the semiconductor laser 30 of FIGS. 1(a) and 1(b) is illustrated in FIGS. 2(a)–2(g). As illustrated in FIG. 2(a), initially, there are successively and epitaxially grown on the n-type GaAs substrate the n-type $Al_{0.5}Ga_{0.5}As$ lower cladding layer 2, the active layer 3 including the multiple quantum well structure, and the p-type $Al_{0.5}Ga_{0.5}As$ first upper cladding layer 16. Thereafter, as shown in FIG. 2(b), a photoresist film 12 is deposited on the first upper cladding 16 and patterned to include an opening 13 exposing a part of the first upper cladding layer 16. FIG. 2(b) is schematic in nature and shows only one such opening 13 in the photoresist film 12. As shown in FIG. 2(c), typically, a large number of semiconductor lasers are formed simultaneously on a single wafer. The photoresist film 12 typically includes an array of a large number of openings 13, as illustrated in FIG. 2(c). The dashed lines in FIG. 2(c) indicate lines along which the semiconductor wafer is ultimately cleaved, producing semiconductor lasers having facets with window structures where the openings 13 were present in the photoresist resist film 12, i.e., at each end of each laser. As in the prior art semiconductor laser, each of the openings 13 may be square and generally about 40 microns on a side.

Figure 2D:
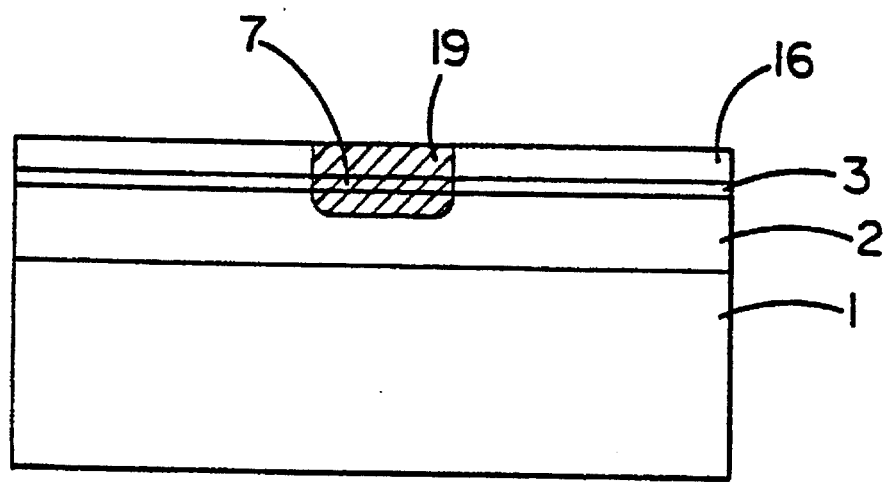

Returning to FIG. 2(b), dopant ions, for example, silicon ions, are implanted in the layered structure through the opening 13 in the photoresist film 12 which functions as an ion implantation mask. As in the prior art structure, it is necessary for the implanted ions to penetrate through the active layer 3 and into the lower cladding layer 2. However, unlike the prior art structure, the thickness through which the ions must penetrate to reach the active layer 3 is only the thickness of the first upper cladding layer 16, a thickness of approximately 0.05 to 0.5 micron. To achieve that depth of penetration, the energy of the silicon ions needs to be only about 60 to 600 keV. These lower energy ions produce a substantially smaller concentration of crystalline defects in the irradiated compound semiconductor layers than the implanted ions of the prior art that have energies three to thirty times larger than the energies employed in the process according to the invention: As in the prior art process, after removal of the photoresist film 12 following the implantation of the dopant impurity ions, an annealing and activation step is carried out to ensure disordering of the multiple quantum well structure of the active layer 3 where the dopant impurity ions have been implanted. As known in the art, the annealing and activation process is carried in an As ambient at a temperature of at least 700° C. Thus, the window regions 19, as illustrated in FIGS. 1(b) and 2(d), are formed, each of which includes a region 7 of the active layer 3 that is disordered.

Figure 2E:
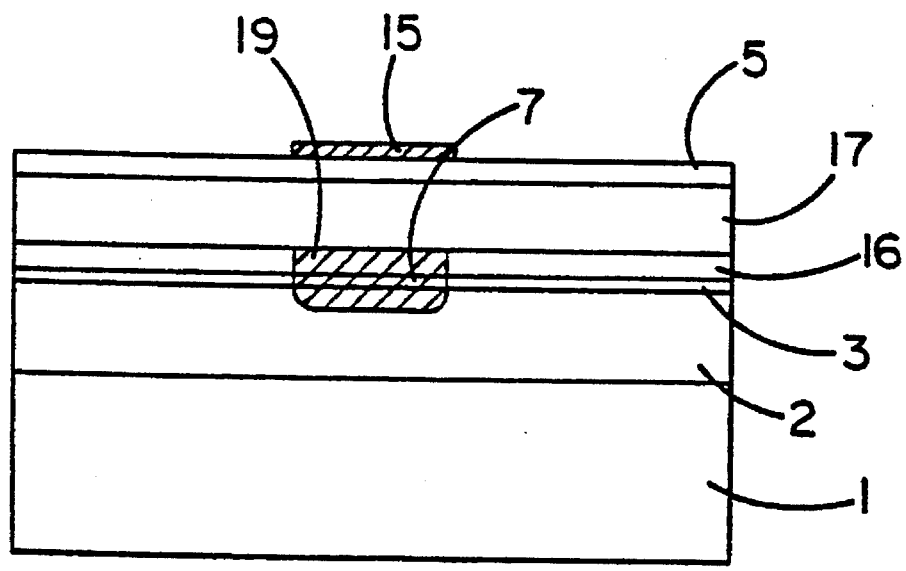

After formation of the window regions 19, the p-type $Al_{0.5}Ga_{0.5}As$ second upper cladding layer 17 and the p-type GaAs first contacting layer 5 are successively and epitaxially grown on the first upper cladding 16. In order to contain the light produced by the semiconductor laser in the active layer 3, the total thickness of the first upper cladding layer 16 and the second upper cladding layer 17 should be at least 1.5 microns. Since the first upper cladding layer 16 has a thickness of 0.05 to 0.5 micron, the second upper cladding layer 17 should have a thickness of at least 1 to 1.45 microns. In order to form a ridge, an insulating layer is formed on the second contacting layer 5 and patterned to form a stripe extending between the facets as an etching mask 15, as shown in FIG. 2(e). The etching mask 15 is aligned with the window regions, i.e., is directly opposite the disordered parts 7 of the active layer 3.

Wet etching using the etching mask 15 to protect a central part of the second upper cladding layer 17 and the first contacting layer 5 produces a ridge 18. Etchants for removal of parts of the second upper cladding layer 17 and the first contacting layer 5 include a mixture of tartaric acid and hydrogen peroxide or a mixture of sulfuric acid, hydrogen peroxide, and water. Thereafter, as illustrated in FIG. 2(g), the current blocking layer 8 is grown on the first upper cladding layer 16, preferably using a process that does not result in growth of any material on the etching mask 15. The current blocking layer 8 contacts the sides of and sandwiches the ridge 18. After removal of the etching mask 15, the p-type GaAs second contacting layer 9 is epitaxially grown on the first contacting layer 5 and the current blocking layer 8. Finally, the electrodes 10 and 11 are formed on opposite sides of the structure to complete the semiconductor laser.

Since, in the process described, the dopant impurity ions that are implanted have a lower energy than the ions that must be employed in the prior art process, the concentration of crystalline defects that are created in the ion implantation process is significantly reduced. Thus, there is a significant reduction in the crystalline defects in the window region that can absorb light and interfere with the reduction in light absorption that is intended to be produced by the window structures. Moreover, since the number of crystalline defects is significantly reduced, few of the implanted dopant ions are trapped by crystalline defects and disordering of the active layer 3 in the window regions 19 is easily and efficiently achieved.

Although specific embodiments of the invention have been described as employing GaAs and AlGaAs for particular layers, other compound semiconductor materials can be employed in various layers of a semiconductor laser according to the invention. Even when the same materials described for the specific embodiment are employed, the upper and lower cladding layers are not limited to $Al_{0.5}Ga_{0.5}As$ and may have other concentrations of aluminum. The conductivity types of the respective layers can also be reversed in semiconductor lasers according to the invention. The dopant impurity ions implanted to form the window regions are not limited to silicon and other dopant impurity ions, such as zinc ions, can also be employed according to the invention.

In the process described with respect to FIGS. 2(a)–2(g), the first upper cladding layer 16 on which the second upper cladding layer and the first contacting layer 5 are subsequently grown includes as much aluminum as gallium. The aluminum at the surface of that layer may be oxidized during the laser fabrication process and the resulting surface oxide may interfere with subsequent processing. To eliminate this problem, the surface oxide layer on the first upper cladding layer 16 may be removed by etching with chlorine or a gaseous compound including chlorine before growing the second upper cladding layer 17.

Figure 3:
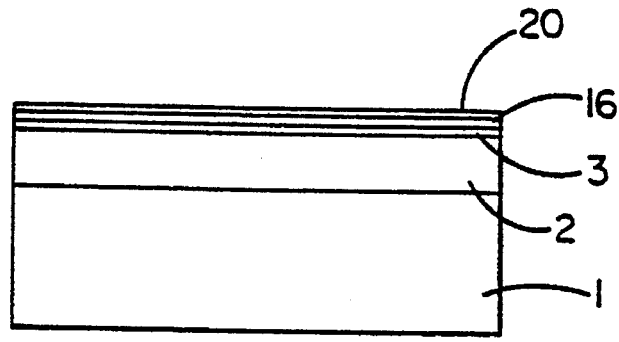
FIG. 3 is a cross-sectional view illustrating a process step in producing a semiconductor laser in accordance with an embodiment of the invention.

When removal of the surface oxide layer by chlorine etching is insufficient, for example, when the surface oxide layer becomes too thick because of lengthy exposure of the surface to air, an alternative method of avoiding the adverse effects of the oxide layer can be employed. As shown in FIG. 3, after growth of the first upper cladding layer 16 and before the ion implantation step, a GaAs surface protection layer 20 is grown on the first upper cladding layer 16. After formation of the window structure and just before the second upper cladding layer 17 is grown, the GaAs surface protection layer 20 is removed by etching, leaving a clean surface for the growth of the second upper cladding layer 17.

Figure 2F:
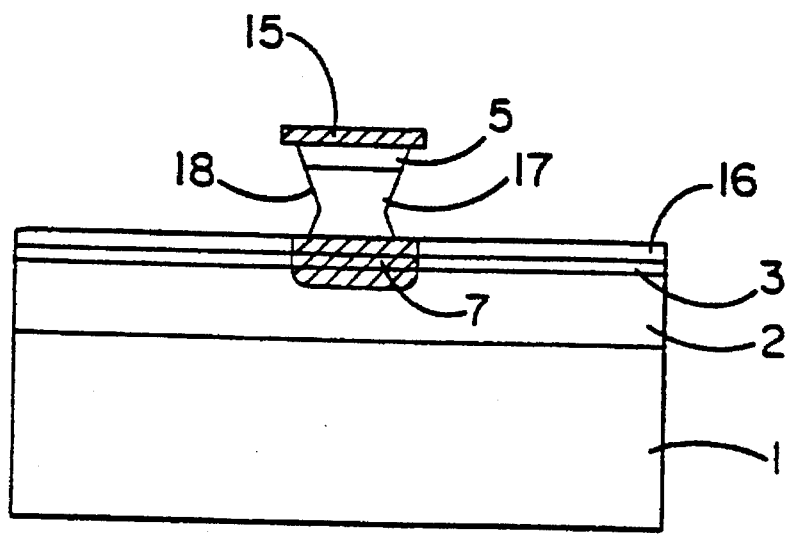
Figure 2G:
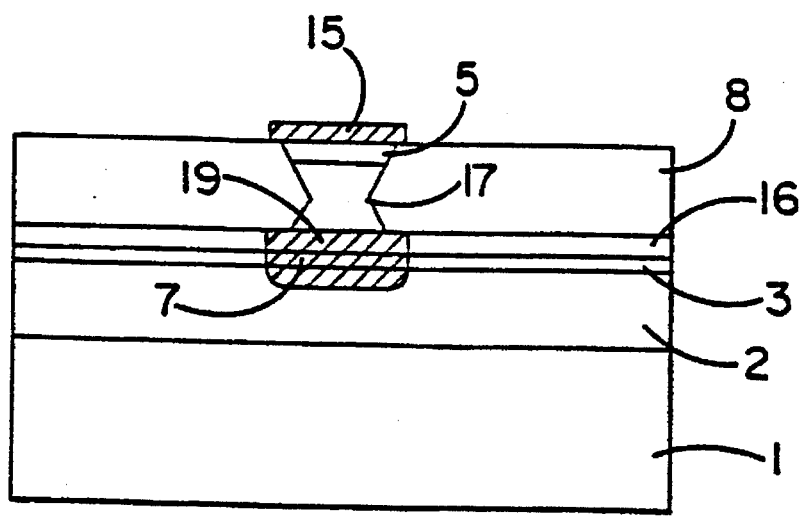
Figure 4A:
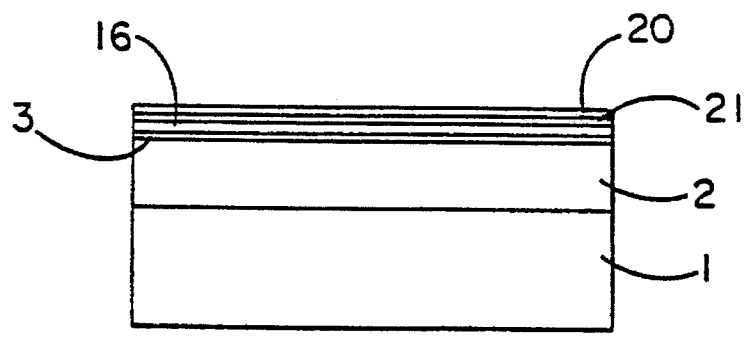
FIGS. 4(a) and 4(b) are cross-sectional views illustrating process steps in producing a semiconductor laser in accordance with an embodiment of the invention.
Figure 4B:
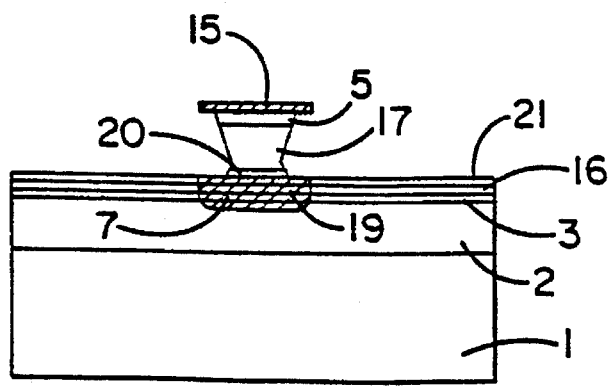

In the step illustrated in FIG. 2(f), the first contacting layer 5 and the second upper cladding layer 17 are etched to expose the first upper cladding layer 16. Precise control of that etching step is required in order to ensure that the first upper cladding layer 16 is exposed and that that layer is not damaged, penetrated, nor removed by excessive etching. Thus, precision control of the etching process is required. Even with precision etching control, the amount of local etching can vary over the surface of a relatively large wafer, causing variation in the characteristics of semiconductor lasers produced from the wafer and varying yields. This problem of etching process control can be solved, as illustrated in FIG. 4(a), by successively growing a thin p-type $Al_{0.5}Ga_{0.5}As$ etch stopping layer 21 and a thin GaAs surface protection layer 20 on the first upper cladding layer 16 before the formation of the photoresist film 12 and the ion implantation step illustrated in FIG. 2(b). After the formation of the window regions 19 and after the successive growth of the second upper cladding layer 17 and the first contacting layer 5, and the formation of the etching mask 15, the layers 5 and 17 are etched. In the etching process, the GaAs protection layer 20 that is not covered by the ridge 18 is removed to expose the etch stopping layer 21. A selective etchant is employed, such as a mixture of an organic acid and hydrogen peroxide, that etches the surface protection layer 20 but does not etch the etch stopping layer 21 so that the second upper cladding layer 17 can be completely removed as desired without damaging the first upper cladding layer 16, as illustrated in FIG. 4(b).

The composition of the materials in the multiple quantum well structure of the active layer controls the wavelength of the light produced by the semiconductor laser. In a semiconductor laser producing having a wavelength of about 780 nanometers, in order to prevent undue absorption of the laser light in the etch stopping layer 21, the aluminum composition t in the $Al_tGa_{1-t}As$ etch stopping layer should be in the range of $0.2<t<1$. However, in a semiconductor laser producing light having a wavelength of about 980 nanometers that is used in a fiber optic amplifier as an excitation light source, the well layers of the multiple quantum well structure of the active layer are InGaAs rather than AlGaAs. In that instance, since GaAs does not absorb light of that wavelength, the surface protection layer 20 can also function as the etch stopping layer 21. However, since, in that case, the surface protection layer 20 remains in the completed semiconductor laser at the side including p-type cladding layers, it is important that the surface protection layer 20 be p-type. In this instance, the etching may be carried out in two steps, first using a mixture of ammonia and hydrogen peroxide or a mixture of an organic acid and hydrogen peroxide to etch and remove parts of the GaAs first contacting layer 5. In the second etching step, only the p-type $Al_{0.5}Ga_{0.5}As$ second upper cladding layer 17 is etched and removed. Etching of that layer is stopped at the p-type GaAs surface protection layer 20. This etching result is achieved using an etchant including chlorine or hydrofluoric acid.

Figure 5A:
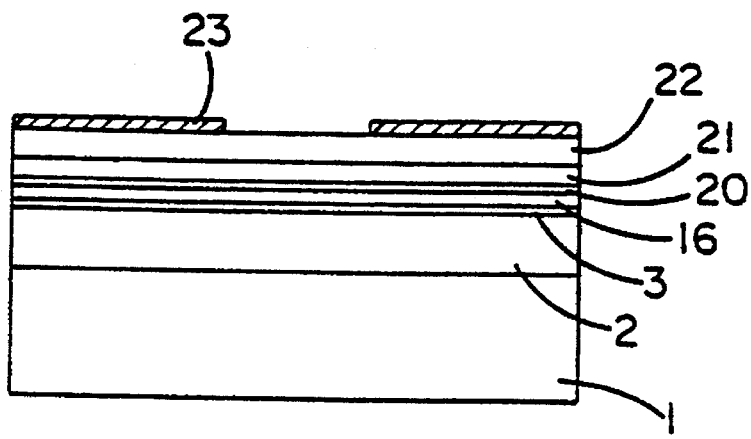
FIGS. 5(a) and 5(b) are cross-sectional views illustrating process steps in producing a semiconductor laser in accordance with an embodiment of the invention.
Figure 5B:
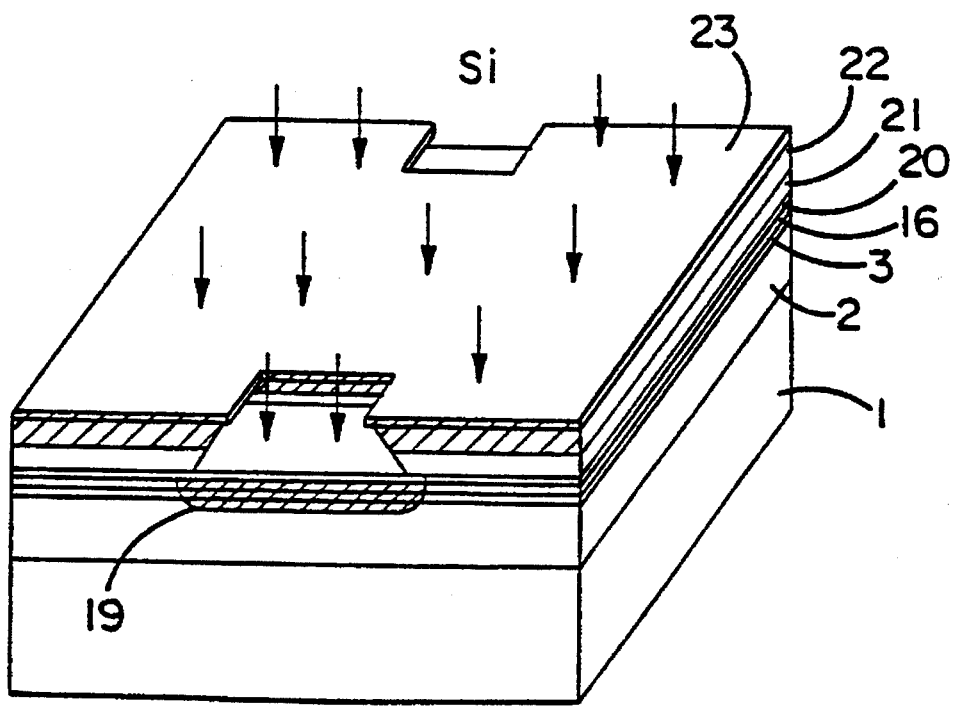

In the process as previously described, a photoresist 12 is used as an ion implantation mask. However, photoresist contaminates a semiconductor surface that it contacts and further contamination can occur when the photoresist is removed with a resist solvent or stripper. The solvent can even attack the first upper cladding layer 16 and alter its thickness. These problems can be overcome by using an epitaxial layer of a semiconductor material as an ion implantation mask. As illustrated in FIG. 5(a), an AlGaAs ion implantation mask 22 is grown on a p-type GaAs etch stopping layer 21. An insulating layer 23 is formed on the mask layer 22 and patterned to have an opening where a window region is to be formed. The AlGaAs ion implantation mask layer 22 is then selectively etched and removed through the opening in the insulating layer 23. For effective etching of the ion implantation mask layer 22, the aluminum composition of that layer is preferably the same as the aluminum composition of the first upper cladding layer 16. After that etching, dopant impurity ions are implanted over the entire wafer surface, as illustrated in FIG. 5(b), to form the window regions 19. The ion implantation mask layer 22 traps the silicon ions where that layer is present. Those ions are removed when the insulating layer 23 and the mask layer 22 are removed.

Figure 6:
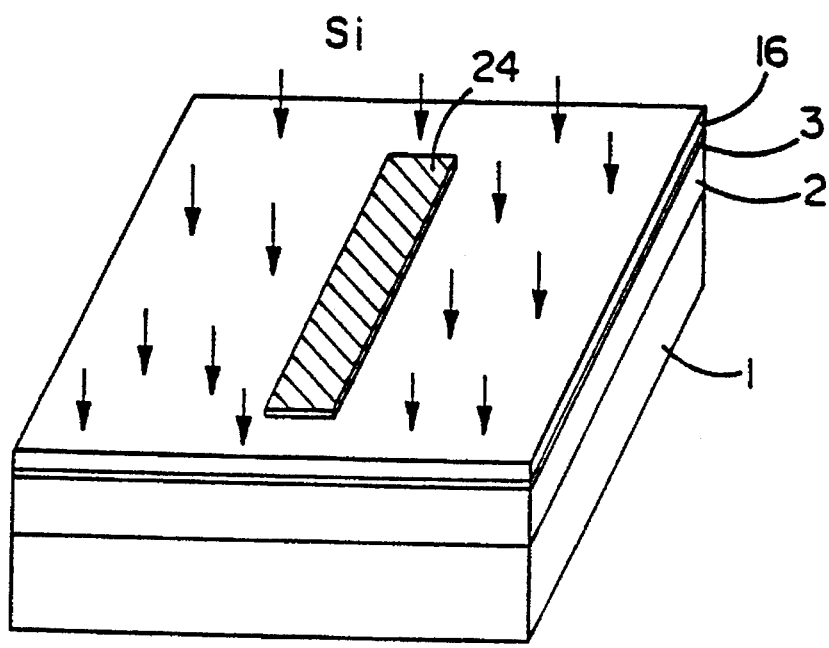
FIG. 6 is a cross-sectional view illustrating a process step in producing a semiconductor laser in accordance with an embodiment of the invention.

In the embodiments of the invention described above, an opening in a mask was prepared where ions are implanted to form window regions of limited volume at facets of the semiconductor lasers. Alternatively, as indicated in FIG. 6, an ion implantation mask 24 may be present only where a ridge of the semiconductor laser will subsequently be formed. That ridge does not extend fully between the laser facets but is spaced from them. In this embodiment, when dopant impurity ions are implanted, they are implanted everywhere except under what becomes the ridge of the semiconductor laser. Thus, the multiple quantum well structure of the active layer 3 is disordered at central regions of the laser at the facets and along the sides of the ridge between the opposed facets of the semiconductor laser. The resulting disordered region has a generally annular shape and a different refractive index from the region of the active layer that is protected by the mask 24, i.e., beneath the ridge. This refractive index difference results in greater confinement of the light produced in the active layer of the semiconductor laser to a region beneath the ridge, reducing the current threshold for laser oscillation as well as the operational current required for the semiconductor laser to produce a particular light output power.

Figure 7:
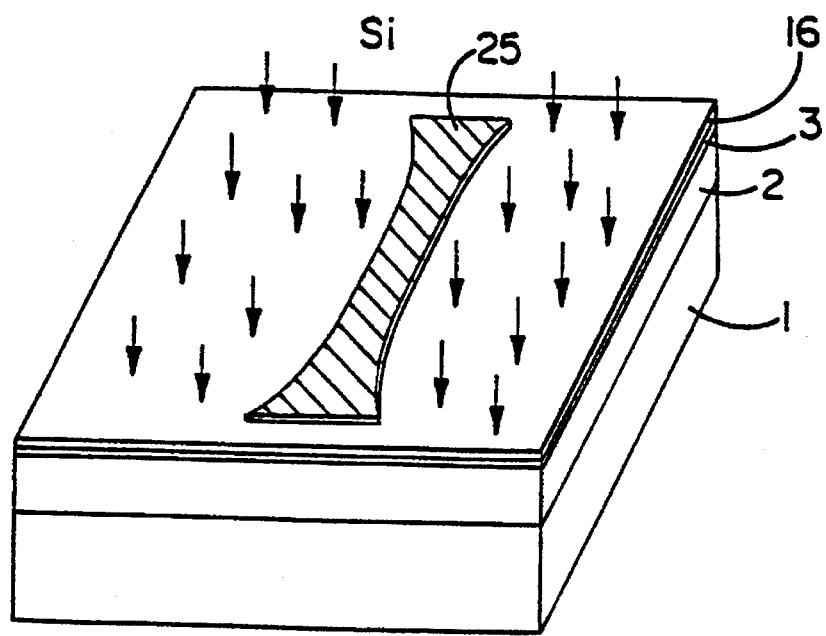
FIG. 7 is a cross-sectional view illustrating a process step in producing a semiconductor laser in accordance with an embodiment of the invention.
Figure 8A:
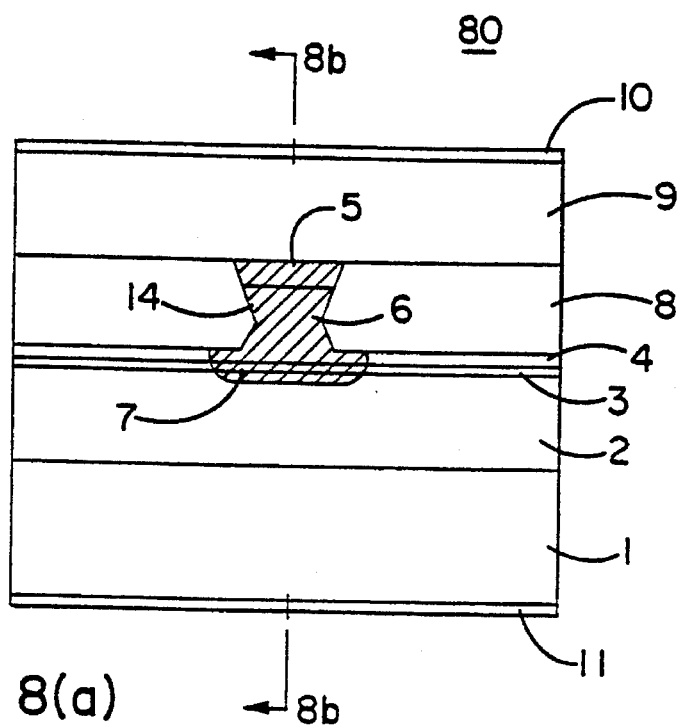
FIGS. 8(a) and 8(b) are end and cross-sectional views, respectively, illustrating a conventional semiconductor laser including window structures.
Figure 8B:
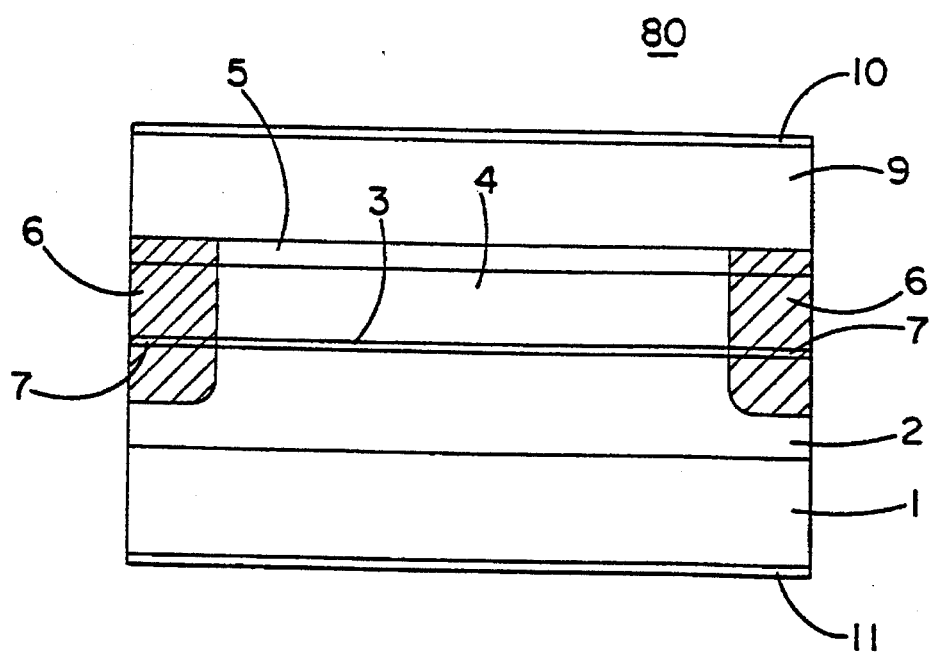
Figure 9A:
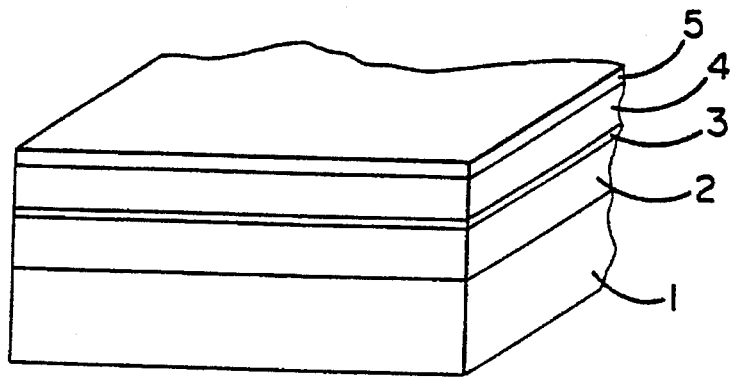
FIGS. 9(a)–9(f) illustrate steps in a method of producing the semiconductor laser of FIGS. 8(a) and 8(b).
Figure 9B:
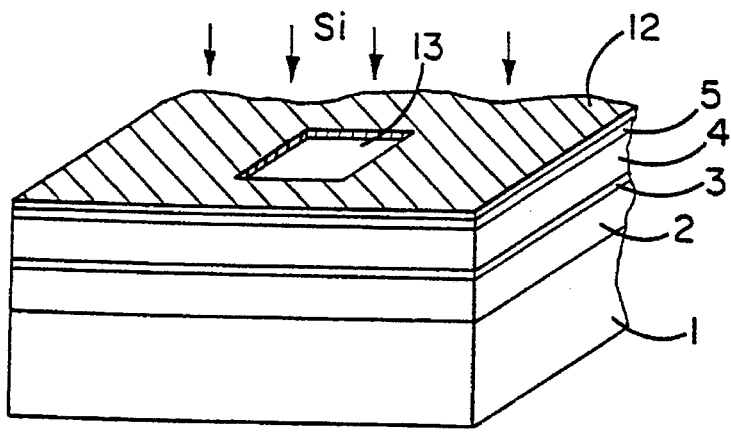
Figure 9C:
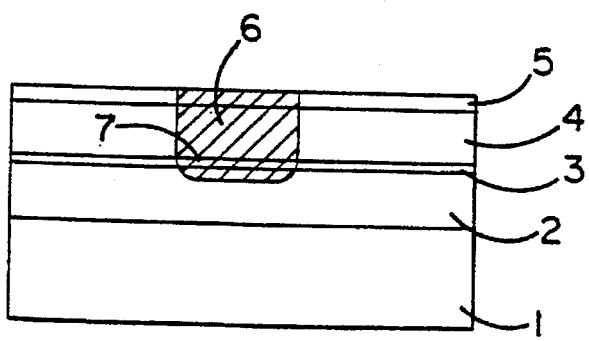
Figure 9D:
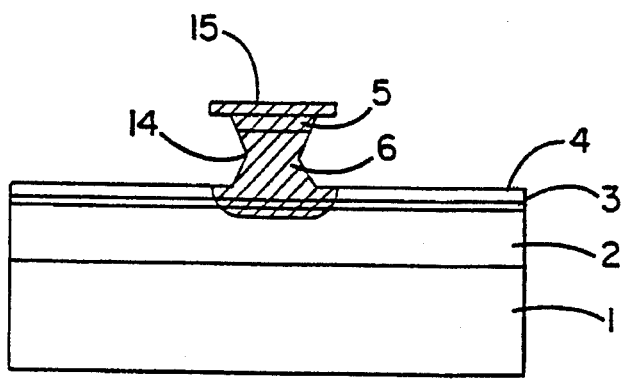
Figure 9E:
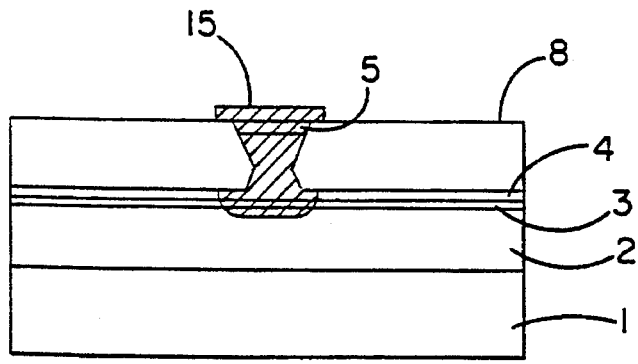
Figure 9F:
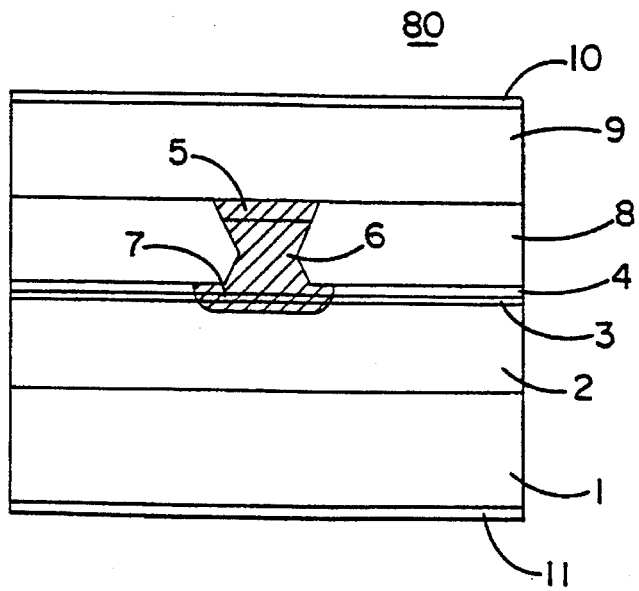
Figure 10A:
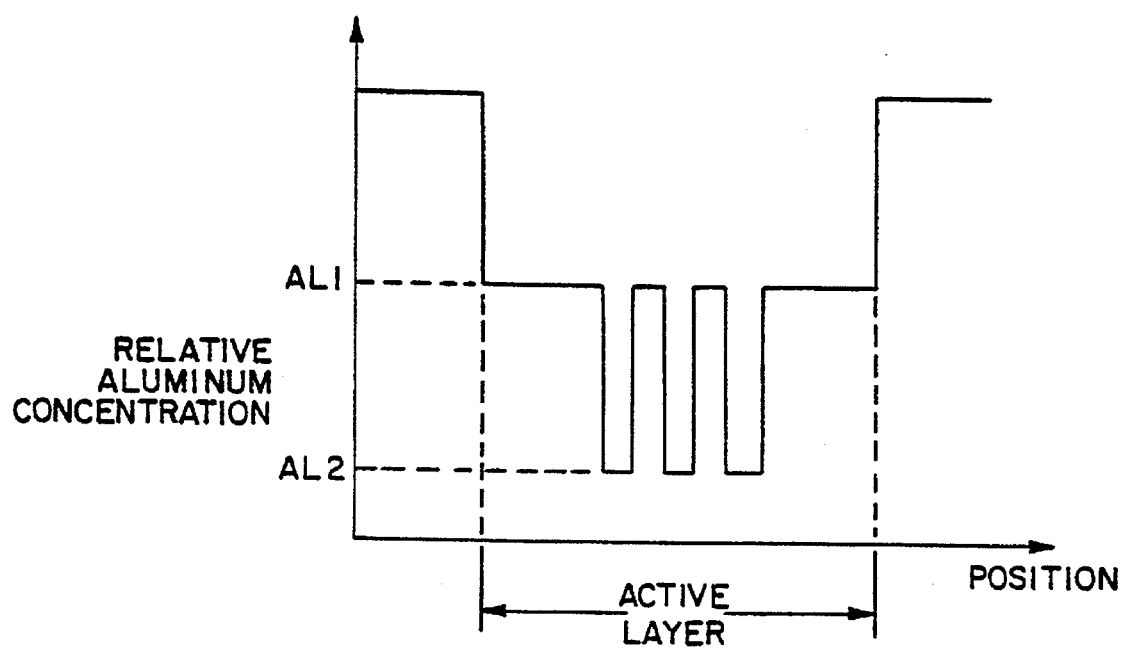
FIGS. 10(a) and 10(b) are graphs illustrating the relative aluminum composition of the active layer and cladding layers within a semiconductor laser and at one of the windows of the semiconductor laser illustrated in FIGS. 8(a) and 8(b).
Figure 10B:
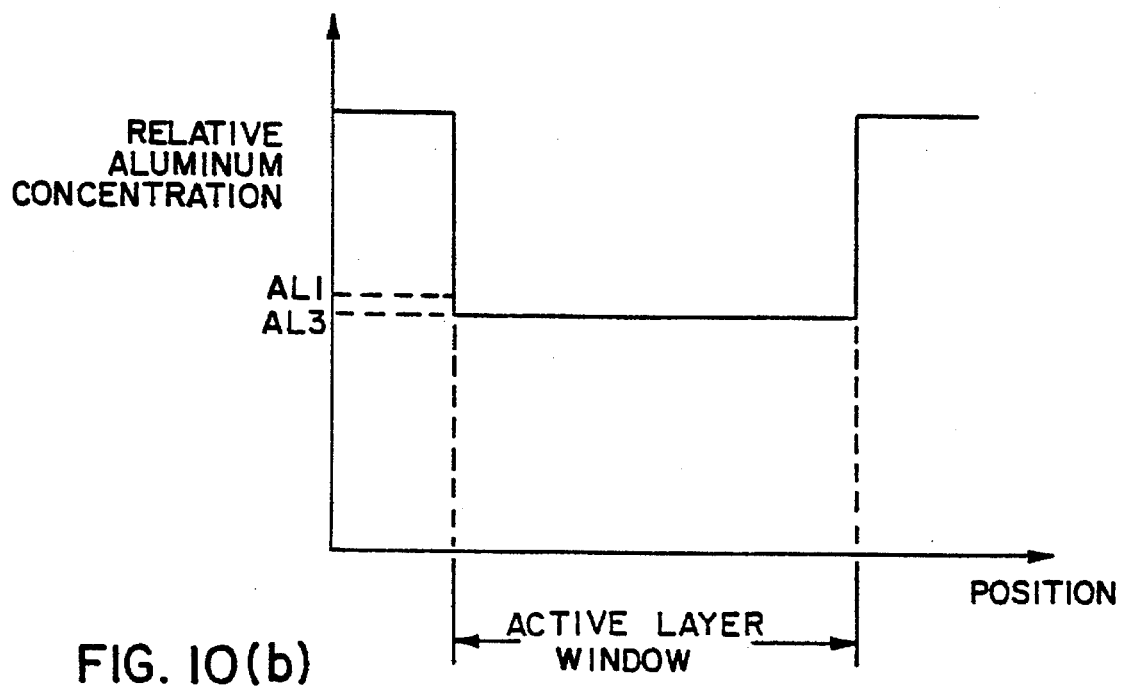

In the embodiment of FIG. 6, the ion implantation mask 24 is rectangular. An alternative, as shown in FIG. 7, is an ion implantation mask 25 that is wider at the ends adjacent the window regions than at the central part of the ridge. Because of this shape, the region of the multiple quantum well structure that is not disordered is wider adjacent the window regions and at the central part of the semiconductor laser. The flaring of the non-disordered regions of the active layer closest to the facets causes a broadening of the laser light and a consequent decrease in the intensity of the light in those regions. This decreased light intensity, in addition to the advantages provided by the window structure, permits a higher light power output from the laser without risk of damage to the laser.

Although embodiments of the invention have been described as employing GaAs as the current blocking layer 8, $Al_wGa_{1-w}As$ can be used in an laser including a second upper cladding layer 17 of $Al_vGa_{1-v}As$ where $w<v$ so that an index of refraction difference is present between the ridge and the current blocking layer. The refractive index difference provides increased light confinement, resulting in lower wave-guide loss within the resonating cavity of the semiconductor laser, reducing both the threshold current for laser oscillation and the operational current employed to drive the semiconductor laser.

We claim:

1. A semiconductor laser comprising:

a compound semiconductor substrate of a first conductivity type;

successively disposed on said semiconductor substrate, a first conductivity type lower cladding layer, an active layer including a multiple quantum well structure, first and second upper cladding layers of a second conductivity type opposite the first conductivity type, and a first contacting layer of the second conductivity type in electrical contact with the second upper cladding layer;

first and second electrodes in electrical contact with the semiconductor substrate and the first contacting layer, respectively, the semiconductor laser including opposed facets transverse to the lower cladding and the first and second upper cladding layers, the second upper cladding layer having a ridge shape that extends between the facets of the semiconductor laser and is centrally disposed on the first upper cladding layer;

a first conductivity type current blocking layer disposed on and between the first upper cladding layer and the first contacting layer, contacting opposite sides of the ridge, and extending between the facets; and a window structure contiguous with each of the facets, each window structure comprising a region including a dopant impurity and disposed within parts of the lower cladding layer, the active layer, and the first upper cladding layer opposite the ridge but not extending substantially into the second upper cladding layer, the multiple quantum well structure of the active layer being disordered in each window region.

2. The semiconductor laser of claim 1 wherein the ridge includes a second conductivity type second contacting layer disposed between and contacting the first upper cladding layer and the first contacting layer.

3. The semiconductor laser of claim 1 wherein the lower cladding layer, the first upper cladding layer, the second upper cladding layer, and the current blocking layer are AlGaAs and the current blocking layer contains a larger proportion of Al than the lower and first and second upper cladding layers.

4. The semiconductor laser of claim 1 wherein the dopant impurity in each window region is Si.

5. The semiconductor laser of claim 1 including a second conductivity type semiconductor surface protection layer containing no Al and disposed between the ridge and the first upper cladding layer and wherein the first upper cladding layer is AlGaAs.

6. The semiconductor laser of claim 5 including a first conductivity type semiconductor etch stopping layer having a composition different from the second upper cladding layer and disposed between the first upper cladding layer and the surface protection layer.

7. The semiconductor laser of claim 1 including a first conductivity type semiconductor etch stopping layer having a composition different from the second upper cladding layer and disposed between the first upper cladding layer and the current blocking layer.

8. The semiconductor laser of claim 1 wherein the dopant impurity is present in the active layer adjacent the ridge and the multiple quantum well structure is disordered between the facets adjacent the ridge.

9. The semiconductor laser of claim 8 wherein the ridge is wider proximate the facets than in a central portion of the semiconductor laser intermediate the facets.

* * * * *